United States Patent
Miyata et al.

(10) Patent No.: US 6,333,258 B1
(45) Date of Patent: Dec. 25, 2001

(54) METHOD OF MANUFACTURING A SEMICONDUCTOR DEVICE

(75) Inventors: Koji Miyata; Toshiaki Hasegawa, both of Kanagawa; Mitsuru Taguchi, Tokyo, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/533,726

(22) Filed: Mar. 23, 2000

(30) Foreign Application Priority Data

Mar. 29, 1999 (JP) .................................................. 11-085138
Jun. 28, 1999 (JP) .................................................. 11-181229

(51) Int. Cl.⁷ .............................................. H01L 21/4763
(52) U.S. Cl. ........................... 438/637; 438/640; 438/701
(58) Field of Search ..................................... 438/637, 638, 438/640, 624, 623, 701

(56) References Cited

U.S. PATENT DOCUMENTS 6,066,569 * 5/2000 Tobben .
6,100,184 * 8/2000 Zhao et al. .
6,127,089 * 10/2000 Subramanian et al. .
6,127,258 * 10/2000 Watanabe et al. .

* cited by examiner

Primary Examiner—Caridad Everhart
(74) Attorney, Agent, or Firm—Ronald P. Kananen; Rader, Fishman & Grauer PLLC

(57) ABSTRACT

A manufacturing method for forming a dual damascene structure in which the effective permittivity of an inter-layer insulating film is lowered without an etching mask for forming a contact hole, which is otherwise formed in the inter-layer insulating film. The manufacturing method comprises the step of forming an inorganic film to serve as an etching mask, on the inter-layer insulating film; the step of forming a first opening pattern for forming a wiring groove, in an upper part of the inorganic film; and the step of forming a second opening pattern for forming a contact hole, so as to coincide with the first opening pattern at least partially. Further, the contact hole is formed in the inter-layer insulating film by employing an etching mask made of the inorganic film, the inorganic film is etched into a state where only a third opening pattern obtained by transferring the first opening pattern is formed, and a wiring groove is formed in the inter-layer insulating film by employing the resulting inorganic film as the etching mask.

14 Claims, 4 Drawing Sheets

METHOD OF MANUFACTURING A SEMICONDUCTOR DEVICE

BACKGROUND OF THE INVENTION

1. Field of the Invention

The present invention relates to a method of manufacturing a semiconductor device. More particularly, it relates to a method of manufacturing a semiconductor device having a multilayer wiring structure as is employed for the device processes of 0.25 [μm] generation et seq.

2. Description of the Related Art

With the microfabrication of semiconductor devices, it has been necessitated to fine wiring lines and reduce a wiring pitch within the semiconductor device. It has also been necessitated to lower the permittivity of an inter-layer insulating film and lower the resistances of the wiring lines, as a lower power dissipation, a higher operating speed etc. have been required of the semiconductor device. In order to achieve the necessities, it has become necessary that copper is used for a wiring material, while a low-permittivity insulating material affording a permittivity of 3.0 or below, such as an organic material including fluorocarbon resin, or as xerogel, is used for a material which is inlaid between wiring layers and the wiring lines.

On the other hand, at the present time at which etching technology for copper has not been established yet, the adoption of a damascene process is indispensable for the application of the metal copper to the wiring material. However, when the steps of a single damascene process for individually forming the wiring line and a plug are merely combined, the number of the steps enlarges to increase both a production cost and a lead time, and this is very disadvantageous in the production of the semiconductor device.

It is therefore desired to establish a dual damascene process in which a wiring groove and a contact hole are simultaneously formed in an insulating material, and in which the wiring line and the plug for one layer are simultaneously formed by the inlaying of an electric conductor such as metal and chemical mechanical polishing (hereinbelow, abbreviated to "CMP"). It is especially wished for to establish a dual damascene process in which a low-permittivity material capable of diminishing wiring capacitances is used as the insulating material between wiring lines and wiring layers.

An etching technique for the low-permittivity material is important for realizing the dual damascene process which uses the low-permittivity material. In particular, the low-permittivity material of organic type has etching characteristics similar to those of a resist mask. It is therefore difficult to employ a resist for a mask for the low-permittivity material. Accordingly, a pattern made of the resist is transferred onto an inorganic material film, thereby to prepare a so-called "hard mask", and the low-permittivity material is etched using the hard mask as the etching mask. In addition, at the present time at which CMP technology for the low-permittivity material has not been satisfactorily developed yet, the hard mask plays also the role of a margin for cutting at the step of the CMP. Therefore, a silicon oxide film is mainly employed as the hard mask material.

In case of forming a dual damascene structure, a manufacturing method to be explained below has heretofore been proposed.

As shown in FIG. 1A of the accompanying drawings, a substrate 110 which is formed with a semiconductor element (not shown), a first wiring line 111, a barrier layer 112, etc. is overlaid with a connection layer 113 which serves as an inter-layer insulating film part to be formed with a contact hole. Thereafter, a hard mask (intermediate layer) 115 provided with a contact hole pattern 114 is formed, and it is overlaid with a wiring layer 116 which serves as an inter-layer insulating film part to be formed with a second wiring line. Further, a hard mask 117 to be provided with a wiring groove pattern is formed.

Subsequently, the hard mask 117 is etched using a resist mask 119 formed with a wiring groove pattern 118. Besides, as shown in FIG. 1B, the hard mask 117 is formed with an opening 120 (wiring groove pattern) for forming a wiring groove. Next, the wiring layer 116 is etched using the hard mask 117 as an etching mask, thereby to form a wiring groove 121. The etching is further caused to proceed until a contact hole 122 is formed in the connection layer 113 as shown in FIG. 1C, by employing the hard mask 115 as an etching mask.

At the next step, as shown in FIG. 1D, that part of the barrier layer 112 which lies at the bottom of the contact hole 122 is etched to denude the first wiring 111. Thereafter, a barrier layer 123 is formed on the walls of the wiring groove 121 and the contact hole 122 by a known copper inlaying technique. Further, the second wiring line 124 and a plug 125 are respectively formed in the wiring groove 121 and the contact hole 122 by a copper film forming technique such as copper plating. Then, a wiring structure is finished up.

With the above manufacturing method, however, the intermediate layer requires a thickness of at least 50 [nm] for the reason that it needs to function as the etching mask in forming the contact hole by the etching. It is therefore difficult to make the intermediate layer thinner than 50 [nm]. Moreover, in the case of using the organic material for the inter-layer insulating film, an inorganic film needs to be used as the intermediate layer. The inorganic film exhibits a comparatively high permittivity on account of the property of an inorganic material. By way of example, a silicon oxide film has a permittivity of 4.2 or so. The prior-art method is therefore difficult of lowering the effective permittivity of the whole wiring structure by thinning the intermediate layer.

SUMMARY OF THE INVENTION:

The present invention has for its object to provide a method of manufacturing a semiconductor device as solves the problems stated above.

Concretely, the present invention resides in a method of manufacturing a semiconductor device which has an inter-layer insulating film, characterized by comprising the step of forming an inorganic film on the inter-layer insulating film, the inorganic film being to serve as an etching mask in a case where said inter-layer insulating film is etched; the step of forming a first opening pattern in an upper part of the inorganic film, the first opening pattern serving to form a wiring groove in the inter-layer insulating film; and the step of forming a second opening pattern in the inorganic film, the second opening pattern serving to form a contact hole in the inter-layer insulating film and being formed so as to coincide with the first opening pattern at least partially.

The method of manufacturing a semiconductor device further comprises the step of forming the contact hole in the inter-layer insulating film by employing as the etching mask the inorganic film formed with the first opening pattern and the second opening pattern; the step of etching the inorganic film into a state where it is formed with only a third opening pattern obtained by transferring the first opening pattern; and the step of forming the wiring groove in the inter-layer insulating film by employing as an etching mask the inorganic film formed with the third opening pattern.

With the above method of manufacturing a semiconductor device, the inorganic film is formed on the inter-layer insulating film, the first opening pattern for forming the wiring groove is formed in the upper part of the inorganic film, and the second opening pattern for forming the contact hole is formed in the inorganic film, so that the etching mask is formed of the single-layer inorganic film. Therefore, the intermediate layer as in the prior art, which functions as the etching mask in the case of forming the contact hole, need not be provided, so that the step of forming the intermediate layer can be omitted.

Furthermore, when the depth of the wiring groove is determined by controlling the etching time period for forming the wiring groove, the intermediate layer is not necessary at all. As compared with the prior-art method, therefore, the above method has the advantage that the effective permittivity of the wiring structure can be made lower.

Besides, in the case where a resist process is employed for each of the step of forming the first opening pattern and the step of forming the second opening pattern, it is permitted to proceed in the state in which the inter-layer insulating film is not denuded. More specifically, the regeneration of the resist process can be done for the reason that the inorganic film covers the inter-layer insulating film in the resist process for forming the first opening pattern in the inorganic film, and for the reason that the resist film is underlaid with the inorganic film in the resist process for forming the second opening pattern in the inorganic film.

In the above method of manufacturing a semiconductor device, the inter-layer insulating film may well be formed by carrying out the step of forming a first inter-layer insulating film; the step of forming an etching stopper layer made of an insulating film, on the first inter-layer insulating film; and the step of forming a second inter-layer insulating film on the etching stopper layer; the etching stopper layer being formed of the same kind of material as that of the inorganic film which is to serve as the etching mask.

Further, the method may well comprise the step of forming an aperture in the second inter-layer insulating film by employing as the etching mask the inorganic film formed with the first opening pattern and the second opening pattern; the step of etching the inorganic film into a state where it is formed with only a third opening pattern obtained by transferring the first opening pattern, and etching a part of the etching stopper layer under a bottom of the aperture, thereby to form an opening; and the step of forming the wiring groove in the second inter-layer insulating film and the contact hole in the first inter-layer insulating film by employing as an etching mask the inorganic film formed with only the third opening pattern.

According to the manufacturing method in which the inter-layer insulating film is formed of the first inter-layer insulating film and the second inter-layer insulating film, the second inter-layer insulating film is etched by employing as the etching mask the inorganic film formed with the first opening pattern and the second opening pattern, whereby the aperture is first formed over the region where the contact hole is to be formed. Besides, the second and first inter-layer insulating films are etched by employing as the etching mask the inorganic film in the state in which only the third opening pattern obtained by transferring the first opening pattern has been formed by the etching. Therefore, the wiring groove is formed in the second inter-layer insulating film, while at the same time, the contact hole is formed in the first inter-layer insulating film by employing as the etching mask the second inter-layer insulating film formed with the aperture. Alternatively, a part from the second inter-layer insulating film to the first inter-layer insulating film is etched by employing as the etching mask the inorganic film formed with the first opening pattern and the second opening pattern, whereby the contact hole is first formed. Besides, the second inter-layer insulating film is etched by employing as the etching mask the inorganic film in the state in which only the third opening pattern obtained by transferring the first opening pattern has been formed by the etching, whereby the wiring groove is formed in the second inter-layer insulating film.

In this manner, the etching stopper layer suffices with only the function of the etching stopper in the case of forming the aperture by etching the second inter-layer insulating film, and hence, it can be formed to the thickness which is, at least, the value sufficient for the action of the etching stopper in the case of etching the second inter-layer insulating film, and which is less than 50 [nm]. Therefore, even when the etching stopper is formed between the first inter-layer insulating film and the second inter-layer insulating film, the effective permittivity of the whole inter-layer insulating film is not sharply raised, and the permittivity becomes lower than in the prior-art structure in which the intermediate layer made of the inorganic film is disposed within the inter-layer insulating film.

By the way, in a situation where the contact hole is not completed when the wiring groove has been formed in the second inter-layer insulating film, the etching of the contact hole may well be executed using the etching stopper layer as a mask. Since, in this case, an etching time period for completing the contact hole is slight, the etching stopper layer need not be as thick as the intermediate layer in the prior art.

Besides, in the case where the resist process is employed for each of the step of forming the first opening pattern in the inorganic film and the step of forming the second opening pattern therein, it is permitted to proceed in the state in which the inter-layer insulating film is not denuded. More specifically, the regeneration of each resist process can be done for the reason that the inorganic film covers the inter-layer insulating film in the resist process for forming the first opening pattern in the inorganic film, and for the reason that the resist film is underlaid with the inorganic film in the resist process for forming the second opening pattern 19 in the inorganic film.

PREFERRED EMBODIMENTS OF THE INVENTION

The first embodiment of a method of manufacturing a semiconductor device according to the present invention will be described in conjunction with the sectional views of processing steps shown in FIGS. 2A thru 2F.

Figure 1A:
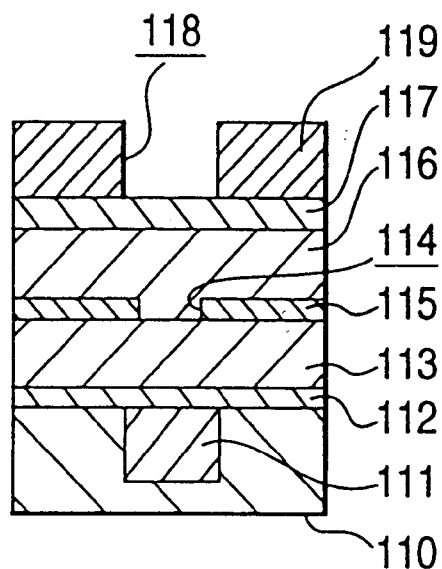
FIGS. 1A thru 1D are sectional views for explaining the steps of a manufacturing process in the prior art.
Figure 1B:
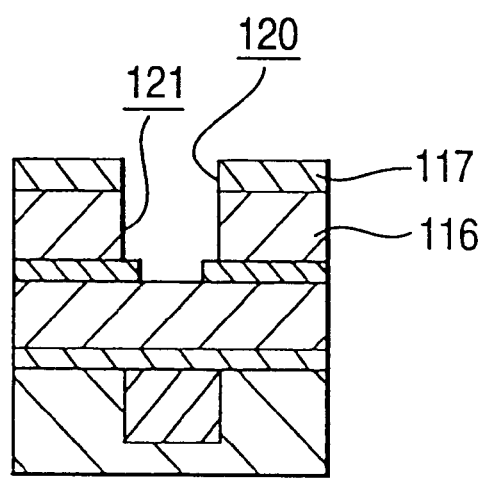
Figure 1C:
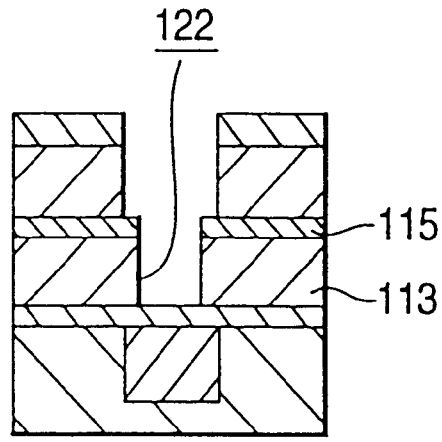
Figure 1D:
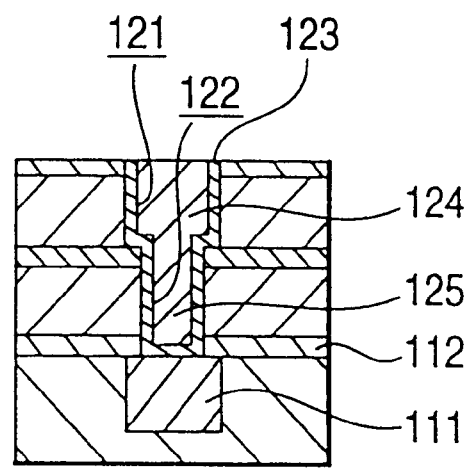
Figure 2A:
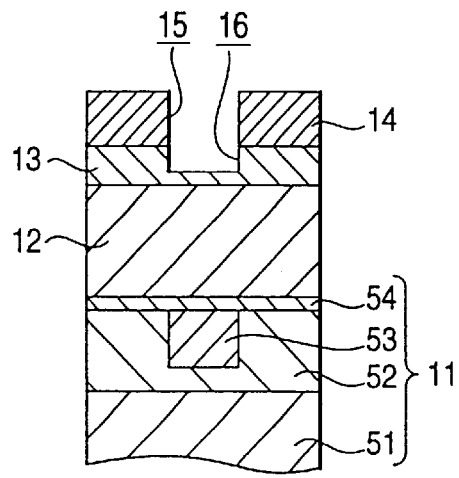
FIGS. 2A thru 2F are sectional views showing the processing steps of the first embodiment of a method of manufacturing a semiconductor device according to the present invention.

As shown in FIG. 2A, a baseplate 11 is, for example, one in which transistors (not shown) are formed on a substrate 51, and in which a wiring line 53 is formed in an inter-layer insulating film 52 covering the substrate 51. A diffusion prevention layer 54 for preventing the diffusion of copper of which the wiring line 53 is made, is formed of, for example, a silicon nitride film on the inter-layer insulating film 52.

The baseplate 11 is overlaid with an inter-layer insulating film 12 to a thickness of, for example, 800 [nm] by employing, for example, any of organic polymers which are generically named "polyaryl ether". The polyaryl ether includes, for example, "FLARE" produced by AlliedSignal Inc., "SiLK" produced by The Dow Chemical Company, and "VELOX" produced by Schuhmacher GmbH. Alternatively, a BCB (bisbenzocyclobutene) film, a polyimide film, an amorphous carbon film, or the like can be employed as the insulating film between wiring lines.

In an example, the film 12 of the organic polymer was formed in such a way that a forerunner was formed into a film on the baseplate 11 by spin coating, followed by curing at 300 [° C.]~450 [° C.].

Subsequently, an inorganic film 13 for forming an inorganic mask is formed on the inter-layer insulating film 12 out of, forexample,a silicon oxide film which is 300 [nm] thick. In an example, the inorganic film 13 was formed in such a way that a conventional CVD (Chemical Vapor Deposition) equipment was employed, that monosilane ($SiH_4$) and nitrous oxide ($N_2O$) were used as starting gases, and that the temperature of the resulting baseplate and the pressure of a film forming atmosphere were respectively set at 350 [° C.] and 1 [kPa]. It is also possible to form the inorganic film 13 out of an oxidized silicon nitride film or a silicon nitride film.

Subsequently, a resist film 14 is formed on the inorganic film 13 by employing an ordinary resist application technique (for example, spin coating). Thereafter, the resist film 14 is patterned by a lithographic technique so as to form an opening 15 for forming a wiring groove. In an example, the lithographic patterning was so implemented that a KrF projection aligner was employed, and that a minimum line width and a minimum wiring interval were respectively set at 0.34 [$\mu$m] and 0.40 [$\mu$m]. Incidentally, it is permitted S employing an ArF projection aligner to form a pattern which has a minimum line width of 0.18 [$\mu$m] and a minimum wiring interval of 0.18 [$\mu$m]. Further, it is permitted by employing an electron-beam exposure technique to obtain a pattern whose minimum line width and minimum wiring interval are both equal to or less than 0.10 [$\mu$m].

At the next step, the inorganic film 13 is etched down to a depth of, for example, 250 [nm] by employing the resist film 14 as an etching mask, thereby to form a first opening pattern 16 for forming the wiring groove. Accordingly, the inorganic film 13 remains at a thickness of 50 [nm] under the bottom of the first opening pattern 16. In an example, the etching was so implemented that a conventional plasma etching equipment was employed, that tetrafluoromethane ($CF_4$) and argon (Ar) were used as an etching gas, and that the level of RF (radio frequency) power and the pressure of an etching atmosphere were respectively set at 1.5 [kW] and 10 [Pa] as etching conditions. By the way, in the etching of the inorganic film 13, the etching depth was controlled by controlling the time period of the etching. The depth of the first opening pattern 16 which is formed on this occasion needs to be determined in consideration of the uniformity of an etching rate within the surface of the wafer in order that the top part of the inter-layer insulating film 12 to serve as the insulating film between the wiring lines may be prevented from being denuded over the whole wafer surface.

Thereafter, the resist film 14 is removed by, for example, ashing. In an example, the ashing was so implemented that a conventional ashing equipment was employed, that oxygen ($O_2$) and helium (He) were used as an ashing gas, and that the temperature of the resulting baseplate was set at 250 [° C.]. Incidentally, during the ashing, the inter-layer insulating film 12 is held in a state where it is covered with the inorganic film 13. Therefore, even when the inter-layer insulating film 12 is formed of the organic film, it is not deteriorated by the ashing.

Figure 2B:
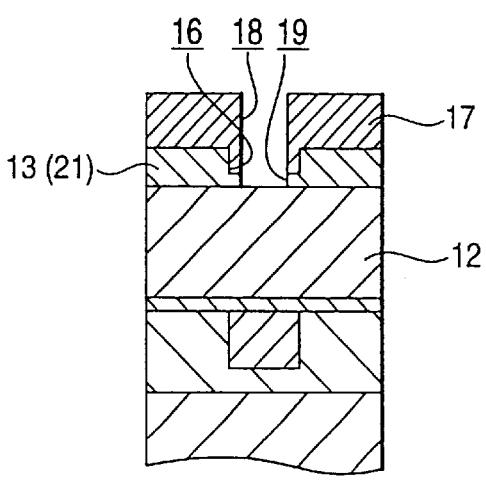

Subsequently, as shown in FIG. 2B, a resist film 17 is formed on the inorganic film 13 by employing an ordinary resist application technique (for example, spin coating). Thereafter, the resist film 17 is patterned by a lithographic technique, whereby an opening 18 for forming a contact hole is formed, for example, so as to be confined within the first opening pattern 16 when the resist film 17 is viewed in plan. In an example, the lithographic patterning was implemented similarly to the foregoing so that the KrF projection aligner was employed, and that the minimum line width and the minimum wiring interval were respectively set at 0.34 [$\mu$m] and 0.40 [$\mu$m]. Incidentally, it is permitted by employing an ArF projection aligner to form a pattern which has a minimum line width of 0.18 [$\mu$m] and a minimum wiring interval of 0.18 [$\mu$m]. Further, it is permitted by employing an electron-beam exposure technique to obtain a pattern whose minimum line width and minimum wiring interval are both equal to or less than 0.10 [$\mu$m]. By the way, the opening 18 may well be formed into a state where it is radially larger than the first opening pattern 16.

At the next step, the inorganic film 13 is etched by employing the resist film 17 as an etching mask, thereby to form a second opening pattern 19 for forming the contact hole in the inter-layer insulating film 12. In an example, the etching was so implemented that a conventional plasma etching equipment was employed, that octafluorobutene ($C_4F_8$), argon (Ar) and carbon monoxide (CO) were used as an etching gas, and that the level of RF power and the pressure of an etching atmosphere were respectively set at 1.5 [kW] and 6 [Pa] as etching conditions. In this way, the first opening pattern 16 for providing the wiring groove and the second opening pattern 19 for providing the contact hole are formed in the inorganic film 13, and an etching mask 21 made of the inorganic film 13 of such a construction is formed on the inter-layer insulating film 12 made of the organic film.

Figure 2C:
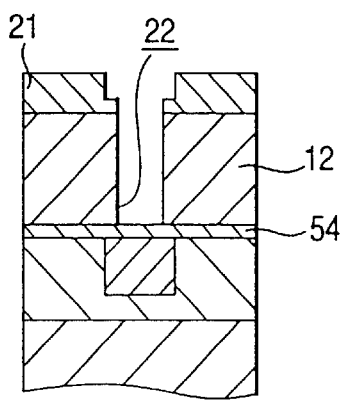

At the next step, as shown in FIG. 2C, the inter-layer insulating film 12 is anisotropically etched using the etching mask 21, thereby to provide the contact hole 22. In an example, the anisotropic etching was so implemented that a conventional ECR (Electron Cyclotron Resonance) plasma etching equipment was employed, that nitrogen ($N_2$) and helium (He) were used as an etching gas, and that the pressure of an etching atmosphere, the level of microwave power and the level of bias RF power were respectively set at 1 [Pa], 1 [kW] and 300 [W] as etching conditions. By the way, since the inter-layer insulating film 12 is underlaid with the diffusion prevention layer 54 made of the silicon nitride film, the etching is stopped on this diffusion prevention layer 54. Besides, at the same time that the inter-layer insulating film 12 is etched, the resist film 17 (refer to FIG. 2B) is etched and is completely removed from on the etching mask 21. It is therefore unnecessary to remove the resist film 17 by ashing.

Figure 2D:
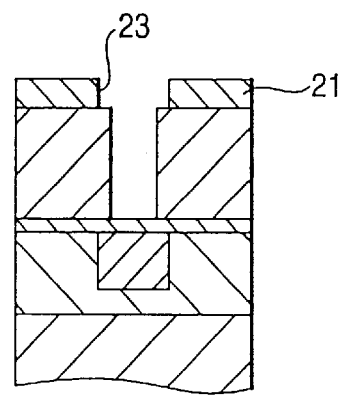

Subsequently, as shown in FIG. 2D, the whole surface of the etching mask 21 is etched back so as to remove that part of the etching mask 21 which surrounds the second opening pattern 19 (refer to FIG. 2B) and to transfer the shape of the first opening pattern 16 (refer to FIG. 2A) onto the lower part of the etching mask 21. Thus, a third opening pattern 23 for forming the wiring groove is formed at each of the corresponding parts of the whole etching mask 21. The upper part of the etching mask 21 is removed by the etching, so that the etching mask 21 becomes about 200 [nm] thick. In an example, the etching was so implemented that a conventional plasma etching equipment was employed, that octafluorobutene ($C_4F_8$), argon (Ar) and carbon monoxide (CO) were used as an etching gas, and that the pressure of an etching atmosphere and the level of RF power were respectively set at 6 [Pa] and 1.5 [kW] as etching conditions.

Figure 2E:
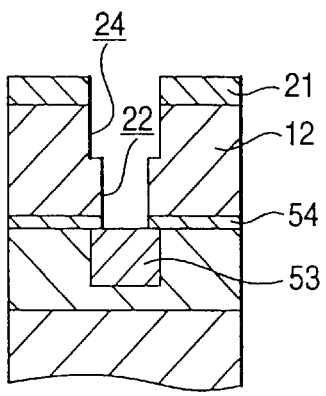

Subsequently, as shown in FIG. 2E, the inter-layer insulating film 12 is anisotropically etched using the resulting etching mask 21, thereby to provide the wiring groove 24 which is, for example, 300 [nm] deep. In an example, the anisotropic etching was so implemented that a conventional ECR plasma etching equipment was employed, that nitrogen ($N_2$) and helium (He) were used as an etching gas, and that the pressure of an etching atmosphere, the level of microwave power and the level of bias RF power were respectively set at 1 [Pa], 1 [kW] and 300 [W] as etching conditions. By the way, in the etching of the inter-layer insulating film 12, the etching depth was controlled by controlling the time period of the etching.

Thereafter, that part of the diffusion prevention layer 54 which underlies the bottom of the contact hole 22 is etched so as to denude the wiring line 53 at the bottom of the contact hole 22. On that occasion, the upper part of the etching mask 21 is sometimes etched depending upon etching conditions.

Figure 2F:
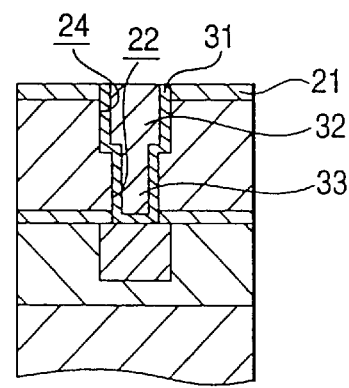

Subsequently, as shown in FIG. 2F, a barrier metal layer 31 made of, for example, tantalum nitride is formed on the walls of the wiring groove 24 and the contact hole 22 to a thickness of, for example, 50 [nm] by sputtering, evaporation or CVD. On that occasion, the barrier metal layer 31 is also extended on the etching mask 21. For example, in the case of forming the barrier metal layer 31 by the sputtering, a tantalum nitride film can be formed by employing a tantalum target and introducing nitrogen gas into a film forming atmosphere.

Subsequently, a seed layer (not shown) is formed on the walls of the wiring groove 24 and the contact hole 22 through the barrier metal layer 31 by, for example, ionization sputtering, whereupon a wiring material (metal), for example, copper is deposited by electroplating. Thereafter, the excessive parts of the metal copper and the barrier metal layer 31 lying on the etching mask 21 are polished and removed by, for example, CMP. Thus, a wiring line 32 made of the metal copper is formed in the wiring groove 24 through the barrier metal layer 31, while a plug 33 made of the metal copper is formed in the contact hole 22 through the barrier metal layer 31. On that occasion, the etching mask 21 serves as a polishing stopper, and it is completely removed in some cases, depending upon its thickness. Incidentally, although the metal copper is inlaid in the above example, another metal material such as aluminum, serving as the wiring material, may well be inlaid.

Although no illustration is made, multilayer wiring can be formed by iteratively executing the processing steps from the step of forming the inter-layer insulating film 12, to the step of forming the wiring line 32 and the plug 33. Also, the part of the inter-layer insulating film 52 between the wiring lines 53 can be formed of an organic material by a process similar to the foregoing.

Besides, although the above description has mentioned the example in which the inter-layer insulating film 12 is formed on the baseplate 11 formed with the semiconductor elements, the manufacturing method is also applicable to a case where the inter-layer insulating film 12, contact hole 22, wiring groove 24, wiring line 32, plug 33, etc. constructed as described above are formed on a baseplate which is not formed with any semiconductor element.

With the above method of manufacturing the semiconductor device, the inorganic film 13 is formed on the inter-layer insulating film 12, the first opening pattern 16 for forming the wiring groove is formed in the upper part of the inorganic film 13, and the second opening pattern 19 for forming the contact hole is formed in the inorganic film 13, so that the etching mask is formed of the single-layer inorganic film 13. Therefore, the intermediate layer as in the prior art, which functions as the etching mask in the case of forming the contact hole, need not be provided, so that the step of forming the intermediate layer can be omitted.

Furthermore, when the depth of the wiring groove 24 is determined by controlling the etching time period for forming the wiring groove 24, the intermediate layer is not necessary at all. As compared with the prior-art method, therefore, the method of the first embodiment has the advantage that the effective permittivity of the wiring structure can be made lower.

Besides, in the case where the resist process is employed for each of the step of forming the first opening pattern 16 and the step of forming the second opening pattern 19, it is permitted to proceed in the state in which the inter-layer insulating film 12 is not denuded. More specifically, the regeneration of the resist process can be done for the reason that the inorganic film 13 covers the inter-layer insulating film 12 in the resist process for forming the first opening pattern 16 in the inorganic film 13, and for the reason that the resist film 17 is underlaid with the inorganic film 13 in the resist process for forming the second opening pattern 19 in the inorganic film 13.

Now, the second embodiment of the method of manufacturing a semiconductor device according to the present invention will be described in conjunction with the sectional views of processing steps shown in FIGS. 3A thru 3F. In FIGS. 3A thru 3F, the same reference numerals are assigned to portions similar to the constituents shown in FIGS. 2A thru 2F.

Figure 3A:
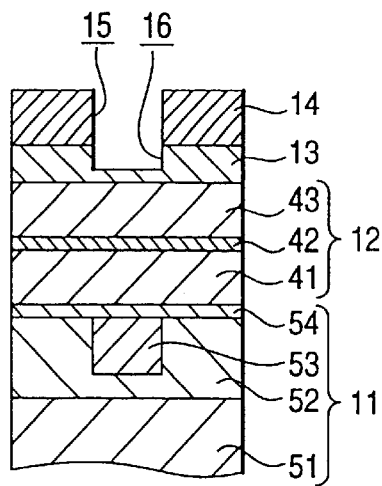
FIGS. 3A thru 3F are sectional views showing the processing steps of the second embodiment of the method of manufacturing a semiconductor device according to the present invention.

As shown in FIG. 3A, a baseplate 11 is, for example, one similar to the baseplate 11 shown in FIG. 2A, in which transistors (not shown) are formed on a substrate 51, and in which a wiring line 53 is formed in an inter-layer insulating film 52 covering the substrate 51. A diffusion prevention layer 54 for preventing the diffusion of copper of which the wiring line 53 is made, is formed of, for example, a silicon nitride film on the inter-layer insulating film 52. The baseplate 11 is overlaid with a first inter-layer insulating film 41 which is to serve as the connection layer of an inter-layer insulating film 12, and which is made of, for example, an organic film of low permittivity being 500 [nm] thick. In an example here, any of organic polymers which are generically named "polyaryl ether" was employed for the first inter-layer insulating film 41. The polyaryl ether includes, for example, "FLARE" produced by AlliedSignal Inc., "SiLK" produced by The Dow Chemical company, and "VELOX" produced by Schuhmacher GmbH. Alternatively, a BCB film, a polyimide film, an amorphous carbon film, or the like can be employed as the insulating film between wiring lines.

In an example, the film 12 of the organic polymer was formed in such a way that a forerunner was formed into a film on the baseplate 11 by spin coating, followed by curing at 300 [° C.]~450 [° C.].

Subsequently, an etching stopper layer 42 is formed on the first inter-layer insulating film 41 by, for example, depositing a silicon oxide film to a thickness of 25 [nm]. Since the etching stopper layer 42 is merely employed as an etching stopper in the case of forming a wiring groove by etching later, it may be formed to a thickness which is, at least, a value sufficient for the action of the etching stopper in the case of etching a second inter-layer insulating film 43 to be explained below, and which is less than 50 [nm]. It is accordingly permitted to form the etching stopper layer 42 thinner than the thickness (about 50 [nm]) of the intermediate layer employed in the prior-art method. In an example, the etching stopper layer 42 made of the silicon oxide film was formed in such a way that a conventional plasma CVD equipment was employed, that monosilane ($SiH_4$) and nitrous oxide ($N_2O$) were used as starting gases, and that the temperature of the resulting baseplate and the pressure of a film forming atmosphere were respectively set at 350 [° C.] and 1 [kPa]. Although the etching stopper layer 42 was formed of the silicon oxide film here, it can also be formed of a silicon nitride film, an oxidized silicon nitride film or an inorganic SOG (Silicon-On-Glass) film.

Next, the etching stopper layer 42 is overlaid with the second inter-layer insulating film 43 which is to serve as the wiring layer of the inter-layer insulating film 12, and which is made of, for example, an organic film of low permittivity being 300 [nm] thick. In an example here, any of organic polymers which are generically named "polyaryl ether" was employed for the second inter-layer insulating film 43. The polyaryl ether includes, for example, "FLARE" produced by Alliedsignal Inc., "SiLK" produced by The Dow Chemical Company, and "VELOX" produced by Schuhmacher GmbH. Alternatively, a BCB film, a polyimide film, an amorphous carbon film, or the like can be employed as the insulating film between the wiring lines.

In this way, the inter-layer insulating film 12, which consists of the first inter-layer insulating film 41, etching stopper layer 42 and second inter-layer insulating film 43, is formed on the baseplate 11.

Subsequently, an inorganic film 13 for forming an inorganic mask is formed on the inter-layer insulating film 12 out of, for example, a silicon oxide film which is 300 [nm] thick. In an example, the inorganic film 13 was formed in such a way that a conventional CVD equipment was employed, that monosilane ($SiH_4$) and nitrous oxide ($N_2O$) were used as starting gases, and that the temperature of the resulting baseplate and the pressure of a film forming atmosphere were respectively set at 350 [° C.] and 1 [kPa]. The inorganic film 13 can be formed of a silicon-type inorganic insulating film, such as oxidized silicon nitride film or silicon nitride film, alternatively to the silicon oxide film.

Subsequently, a resist film 14 is formed on the inorganic film 13 by employing an ordinary resist application technique (for example, spin coating). Thereafter, the resist film 14 is patterned by a lithographic technique so as to form an opening 15 for forming the wiring groove. In an example, the lithographic patterning was so implemented that a KrF projection aligner was employed, and that a minimum line width and a minimum wiring interval were respectively set at 0.34 [μm] and 0.40 [μm]. Incidentally, it is permitted by employing an ArF projection aligner to form a pattern which has a minimum line width of 0.18 [μm] and a minimum wiring interval of 0.18 [μm]. Further, it is permitted by employing an electron-beam exposure technique to obtain a pattern whose minimum line width and minimum wiring interval are both equal to or less than 0.10 [μm].

At the next step, the inorganic film 13 is etched down to a depth of, for example, 250 [nm] by employing the resist film 14 as an etching mask, thereby to form a first opening pattern 16 for forming the wiring groove. Accordingly, the inorganic film 13 remains at a thickness of 50 [nm] under the bottom of the first opening pattern 16. In an example, the etching was so implemented that a conventional plasma etching equipment was employed, that tetrafluoromethane ($CF_4$) and argon (Ar) were used as an etching gas, and that the level of RF power and the pressure of an etching atmosphere were respectively set at 1.5 [kW] and 10 [Pa] as etching conditions. By the way, in the etching of the inorganic film 13, the etching depth was controlled by controlling the time period of the etching. The depth of the first opening pattern 16 which is formed on this occasion needs to be determined in consideration of the uniformity of an etching rate within the surface of the wafer in order that the top part of the inter-layer insulating film 12 to serve as the insulating film between the wiring lines may be prevented from being denuded over the whole wafer surface.

Thereafter, the resist film 14 is removed by, for example, ashing. In an example, the ashing was so implemented that a conventional ashing equipment was employed, that oxygen ($O_2$) and helium (He) were used as an ashing gas, and that the temperature of the resulting baseplate was set at 250[° C.]. Incidentally, during the ashing, the inter-layer insulating film 12 is held in a state where it is covered with the inorganic film 13. Therefore, even when the inter-layer insulating film 12 is formed of the organic film, it is not deteriorated by the ashing.

Figure 3B:
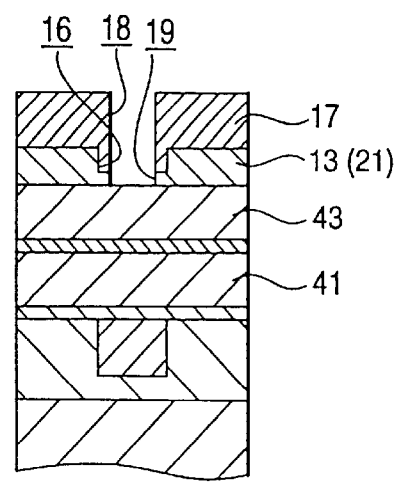

Subsequently, as shown in FIG. 3B, a resist film 17 is formed on the inorganic film 13 by employing an ordinary resist application technique (for example, spin coating). Thereafter, the resist film 17 is patterned by a lithographic technique, whereby an opening 18 for forming a contact hole is formed, for example, so as to be confined within the first opening pattern 16 when the resist film 17 is viewed in plan. In an example, the lithographic patterning was implemented similarly to the foregoing so that the KrF projection aligner was employed, and that the minimum line width and the minimum wiring interval were respectively set at 0.34 [μm] and 0.40 [μm]. Incidentally, it is permitted by employing an ArF projection aligner to form a pattern which has a minimum line width of 0.18 [μm] and a minimum wiring interval of 0.18 [μm]. Further, it is permitted by employing an electron-beam exposure technique to obtain a pattern whose minimum line width and minimum wiring interval are both equal to or less than 0.10 [μm]. By the way, the opening 18 may well be formed into a state where it is radially larger than the first opening pattern 16.

At the next step, the inorganic film 13 is etched by employing the resist film 17 as an etching mask, thereby to form a second opening pattern 19 for forming the contact hole in the first inter-layer insulating film 41. In an example, the etching was so implemented that a conventional plasma etching equipment was employed, that octafluorobutene ($C_4F_8$), argon (Ar) and carbon monoxide (CO) were used as an etching gas, and that the level of RF power and the pressure of an etching atmosphere were respectively set at 1.5 [kW] and 6 [Pa] as etching conditions. In this way, the first opening pattern 16 for providing the wiring groove and the second opening pattern 19 for providing the contact hole are formed in the inorganic film 13, and an etching mask 21 made of the inorganic film 13 of such a construction is formed on the second inter-layer insulating film 43.

Figure 3C:
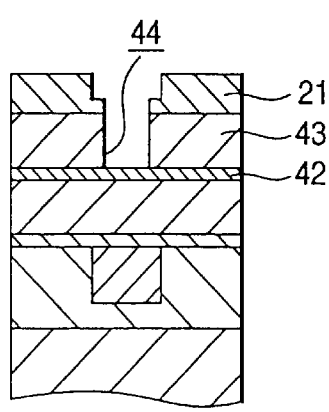

At the next step, as shown in FIG. 3C, the second inter-layer insulating film 43 is anisotropically etched using the etching mask 21, thereby to provide an aperture 44 over a region where the contact hole is to be formed. In an example, the anisotropic etching was so implemented that a conventional ECR plasma etching equipment was employed, that nitrogen ($N_2$) and helium (He) were used as an etching gas, and that the pressure of an etching atmosphere, the level of microwave power and the level of bias RF power were respectively set at 1 [Pa], 1 [kW] and 300 [W] as etching conditions. By the way, since the second inter-layer insulating film 43 is underlaid with the etching stopper layer 42 made of the silicon oxide film, the etching is stopped on this etching stopper layer 42. Besides, at the same time that the second inter-layer insulating film 43 is etched, the resist film 17 (refer to FIG. 3B) is etched and is completely removed from the etching mask 21. It is therefore unnecessary to remove the resist film 17 by ashing.

Figure 3D:
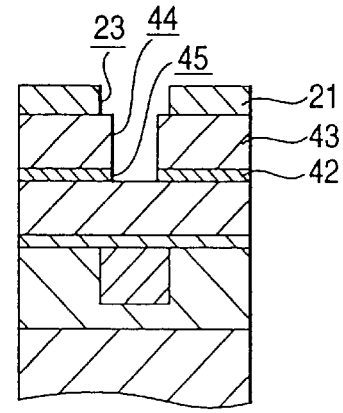

Further, as shown in FIG. 3D, the whole surface of the etching mask 21 is etched back by anisotropic etching so as to remove that part of the etching mask 21 which surrounds the second opening pattern 19 (refer to FIG. 3B) and to transfer the shape of the first opening pattern 16 (refer to FIG. 3A) onto the lower part of the etching mask 21. Thus, a third opening pattern 23 for forming the wiring groove is formed at each of the corresponding parts of the whole etching mask 21. The upper part of the etching mask 21 is removed by the etching, so that the etching mask 21 becomes about 200 [nm] thick. In an example, the etching was so implemented that a conventional plasma etching equipment was employed, that octafluorobutene ($C_4F_8$), argon (Ar) and carbon monoxide (CO) were used as an etching gas, and that the pressure of an etching atmosphere and the level of RF power were respectively set at 6 [Pa] and 1.5 [kW] as etching conditions. Here in the etching, also the etching stopper layer 42 is anisotropically etched with the second inter-layer insulating film 43 acting as an etching mask, and an opening pattern 45 obtained by transferring the aperture 44 is formed in the etching stopper layer 42.

In this manner, the etching for forming the third opening pattern 23 in the etching mask 21, and the etching for forming the opening pattern 45 in the etching stopper layer 42 are carried out at the same time. Therefore, the etching stopper layer 42 (refer to FIG. 3A) and the inorganic film 13 (refer to FIG. 3A) to serve as the etching mask 21 should desirably be formed of the same kind of material. Alternatively, they should desirably be formed of materials which are etched by identical etching.

Figure 3E:
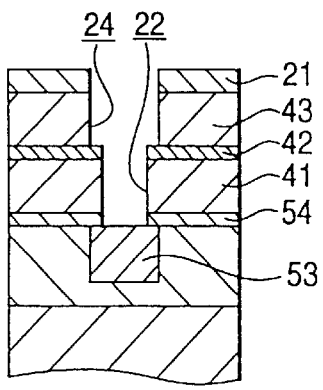

Subsequently, as shown in FIG. 3E, the second inter-layer insulating film 43 is anisotropically etched using the resulting etching mask 21, and the first inter-layer insulating film 41 is anisotropically etched using the resulting second inter-layer insulating film 43 as an etching mask, thereby to provide the wiring groove 24 in the second inter-layer insulating film 43 and to provide the contact hole 22 in the first inter-layer insulating film 41. In an example, the anisotropic etching was so implemented that a conventional ECR plasma etching equipment was employed, that nitrogen ($N_2$) and helium (He) were used as an etching gas, and that the pressure of an etching atmosphere, the level of microwave power and the level of bias RF power were respectively set at 1 [Pa], 1 [kW] and 300 [w] as etching conditions.

By the way, in a situation where the contact hole 22 is not completed when the wiring groove 24 has been formed in the second inter-layer insulating film 43, the etching of the contact hole 22 may well be executed using the etching stopper layer 42 as a mask. Since, in this case, an etching time period for completing the contact hole 22 is slight, the etching stopper layer 42 need not be as thick as the intermediate layer in the prior art and may be formed thinner than the intermediate layer in the prior art.

In the example of the second embodiment, the first inter-layer insulating film 41 and the second inter-layer insulating film 43 are formed of the same kind of insulating material. However, the first inter-layer insulating film 41 and the second inter-layer insulating film 43 can also be formed of different kinds of insulating materials as long as the materials are etched under the same etching conditions.

Thereafter, that part of the diffusion prevention layer 54 which underlies the bottom of the contact hole 22 is etched so as to denude the wiring line 53 at the bottom of the contact hole 22.

Figure 3F:
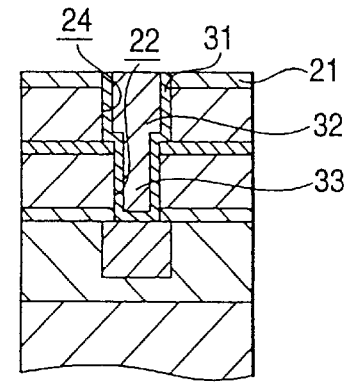

Subsequently, as shown in FIG. 3F, a barrier metal layer 31 made of, for example, tantalum nitride is formed on the walls of the wiring groove 24 and the contact hole 22 to a thickness of, for example, 50 [nm] by sputtering, evaporation or CVD. On that occasion, the barrier metal layer 31 is also extended on the etching mask 21. For example, in the case of forming the barrier metal layer 31 by the sputtering, a tantalum nitride film can be formed by employing a tantalum target and introducing nitrogen gas into a film forming atmosphere.

Subsequently, a seed layer (not shown) is formed on the walls of the wiring groove 24 and the contact hole 22 through the barrier metal layer 31 by, for example, ionization sputtering, whereupon a wiring material (metal), for example, copper is deposited by electroplating. Thereafter, the excessive parts of the metal copper and the barrier metal layer 31 lying on the etching mask 21 are polished and removed by, for example, CMP. Thus, a wiring line 32 made of the metal copper is formed in the wiring groove 24 through the barrier metal layer 31, while a plug 33 made of the metal copper is formed in the contact hole 22 through the barrier metal layer 31. On that occasion, the etching mask 21 serves as a polishing stopper, and it is completely removed in some cases, depending upon its thickness. Incidentally, although the metal copper is inlaid in the above example, another metal material such as aluminum, serving as the wiring material, may well be inlaid.

Although no illustration is made, multilayer wiring can be formed by iteratively executing the processing steps from the step of forming the inter-layer insulating film 12, to the step of forming the wiring line 32 and the plug 33. Also, the part of the inter-layer insulating film 52 between the wiring lines 53 can be formed of an organic material by a process similar to the foregoing.

Besides, although the above description has mentioned the example in which the inter-layer insulating film 12 is formed on the baseplate 11 formed with the semiconductor elements, the manufacturing method is also applicable to a case where the inter-layer insulating film 12, contact hole 22, wiring groove 24, wiring line 32, plug 33, etc. constructed as described above are formed on a baseplate which is not formed with any semiconductor element.

According to the manufacturing method described with reference to FIGS. 3A thru 3F, the second inter-layer insulating film 43 is etched by employing as the etching mask 21 the inorganic film 13 formed with the first opening pattern 16 and the second opening pattern 19, whereby the aperture 44 is first formed over the region where the contact hole 22 is to be formed. Besides, the second and first inter-layer insulating films 43 and 41 are etched by employing as the etching mask 21 the inorganic film 13 in the state in which only the third opening pattern 23 obtained by transferring the first opening pattern 16 has been formed by the etching. Therefore, the wiring groove 24 is formed in the second inter-layer insulating film 43, while at the same time, the contact hole 22 is formed in the first inter-layer insulating film 41 by employing as the etching mask the second inter-layer insulating film 43 formed with the aperture 44.

In the above etching, the etching stopper layer 43 suffices with only the function of the etching stopper in the case of forming the aperture 44 by etching the second inter-layer insulating film 43, and hence, it can be formed to the thickness which is, at least, the value sufficient for the action of the etching stopper in the case of etching the second inter-layer insulating film 43, and which is less than 50 [nm]. Therefore, even when the etching stopper 42 is formed between the first inter-layer insulating film 41 and the second inter-layer insulating film 43, the effective permittivity of the whole inter-layer insulating film 12 is not sharply raised, and the permittivity becomes lower than in the prior-art structure in which the intermediate layer made of the inorganic film is disposed within the inter-layer insulating film.

By the way, in a situation where the contact hole 22 is not completed when the wiring groove 24 has been formed in the second inter-layer insulating film 43, the etching of the contact hole 22 may well be executed using the etching stopper layer 42 as a mask. Since, in this case, an etching time period for completing the contact hole 22 is slight, the etching stopper layer 42 need not be as thick as the intermediate layer in the prior art and may be formed thinner than the intermediate layer. Therefore, the effective permittivity is made lower than in the prior-art inter-layer insulating film structure provided with the intermediate layer.

Besides, in the case where the resist process is employed for each of the step of forming the first opening pattern 16 in the inorganic film 13 and the step of forming the second opening pattern 19 therein, it is permitted to proceed in the state in which the inter-layer insulating film 12 is not denuded. More specifically, the regeneration of the resist process can be done for the reason that the inorganic film 13 covers the inter-layer insulating film 12 in the resist process for forming the first opening pattern 16 in the inorganic film 13, and for the reason that the resist film 17 is underlaid with the inorganic film 13 in the resist process for forming the second opening pattern 19 in the inorganic film 13.

Now, the third embodiment of the method of manufacturing a semiconductor device according to the present invention will be described in conjunction with the sectional views of processing steps shown in FIGS. 4A thru 4F. In FIGS. 4A thru 4F, the same reference numerals are assigned to portions similar to the constituents shown in FIGS. 3A thru 3F.

Figure 4A:
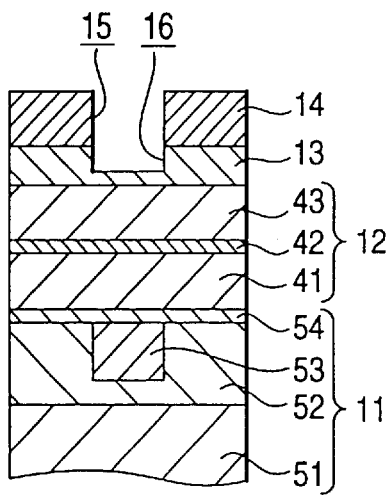
FIGS. 4A thru 4F are sectional views showing the processing steps of the third embodiment of the method of manufacturing a semiconductor device according to the present invention.

As shown in FIG. 4A, a baseplate 11 is, for example, one similar to the baseplate 11 shown in FIG. 2A, in which transistors (not shown) are formed on a substrate 51, and in which a wiring line 53 is formed in an inter-layer insulating film 52 covering the substrate 51. A diffusion prevention layer 54 for preventing the diffusion of copper of which the wiring line 53 is made, is formed of, for example, a silicon nitride film on the inter-layer insulating film 52. The baseplate 11 is overlaid with a first inter-layer insulating film 41 which is to serve as the connection layer of an inter-layer insulating film 12, and which is made of, for example, an organic film of low permittivity being 500 [nm] thick. Here, the first inter-layer insulating film 41 is formed of the same material and by the same forming method as those of the inter-layer insulating film 41 explained in the second embodiment.

Subsequently, an etching stopper layer 42 is formed on the first inter-layer insulating film 41 by, for example, depositing a silicon oxide film to a thickness of 25 [nm]. Since the etching stopper layer 42 is merely employed as an etching stopper in the case of forming a wiring groove by etching later, it may be formed to a thickness which is, at least, a value sufficient for the action of the etching stopper in the case of etching a second inter-layer insulating film 43 to be explained below, and which is less than 50 [nm]. It is accordingly permitted to form the etching stopper layer 42 thinner than the thickness (about 50 [nm]) of the intermediate layer employed in the prior-art method. The etching stopper layer 42 is formed by the same method as described in the second embodiment. Incidentally, the etching stopper layer 42 may well be formed of a silicon nitride film, an oxidized silicon nitride film or an inorganic SOG film.

Next, the etching stopper layer 42 is overlaid with the second inter-layer insulating film 43 which is to serve as the wiring layer of the inter-layer insulating film 12, and which is made of, for example, an organic film of low permittivity being 300 [nm] thick. Here, the second inter-layer insulating film 43 is formed of the same material and by the same forming method as those of the second inter-layer insulating film 43 explained in the second embodiment.

In this way, the inter-layer insulating film 12, which consists of the first inter-layer insulating film 41, etching stopper layer 42 and second inter-layer insulating film 43, is formed on the baseplate 11.

Subsequently, an inorganic film 13 for forming an inorganic mask is formed on the inter-layer insulating film 12 out of, for example, a silicon oxide film which is 300 [nm] thick. The forming method of the inorganic film 13 is the same as that of the inorganic film 13 explained in the second embodiment. The inorganic film 13 can be formed of a silicon-type inorganic insulating film, such as oxidized silicon nitride film or silicon nitride film, alternatively to the silicon oxide film.

Subsequently, a resist film 14 is formed on the inorganic film 13 by employing an ordinary resist application technique (for example, spin coating). Thereafter, the resist film 14 is patterned by a lithographic technique so as to form an opening 15 for forming the wiring groove. Regarding the minimum width of the opening 15, as described in the second embodiment, a pattern of 0.10 [μm] or below can be obtained by selecting a projection aligner and an exposure light source.

At the next step, the inorganic film 13 is etched down to a depth of, for example, 250 [nm] by employing the resist film 14 as an etching mask, thereby to form a first opening pattern 16 for forming the wiring groove. Accordingly, the inorganic film 13 remains at a thickness of 50 [nm] under the bottom of the first opening pattern 16. The etching is implemented by the same method as described in the second embodiment. By the way, in the etching of the inorganic film 13, the etching depth was controlled by controlling the time period of the etching. The depth of the first opening pattern 16 which is formed on this occasion needs to be determined in consideration of the uniformity of an etching rate within the surface of the wafer in order that the top part of the inter-layer insulating film 12 to serve as the insulating film between the wiring lines may be prevented from being denuded over the whole wafer surface.

Thereafter, the resist film 14 is removed by a conventional resist removal technique, for example, ashing with oxygen plasma. In the case of the ashing, during the removal of the resist film 14, the inter-layer insulating film 12 is held in a state where it is covered with the inorganic film 13. Therefore, even when the inter-layer insulating film 12 is formed of the organic film, it is not deteriorated by the ashing.

Figure 4B:
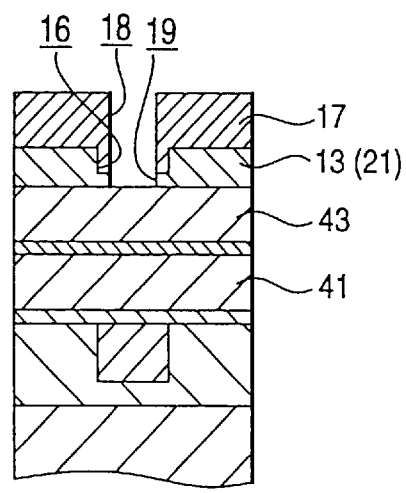

Subsequently, as shown in FIG. 4B, a resist film 17 is formed on the inorganic film 13 by employing an ordinary resist application technique (for example, spin coating). Thereafter, the resist film 17 is patterned by a lithographic technique, whereby an opening 18 for forming a contact hole is formed, for example, so as to be confined within the first opening pattern 16 when the resist film 17 is viewed in plan. Regarding the minimum width of the opening 18, as described in the second embodiment, a pattern of 0.10 [$\mu$m] or below can be obtained by selecting a projection aligner and an exposure light source. By the way, the opening 18 may well be formed into a state where it is partially protrusive out of the first opening pattern 16.

At the next step, the inorganic film 13 is etched by employing the resist film 17 as an etching mask, whereby a second opening pattern 19 for forming the contact hole in the first inter-layer insulating film 41 is formed by, for example, the same method as explained in the second embodiment. In this way, the first opening pattern 16 for providing the wiring groove and the second opening pattern 19 for providing the contact hole are formed in the inorganic film 13, and an etching mask 21 made of the inorganic film 13 of such a construction is formed on the second inter-layer insulating film 43.

Figure 4C:
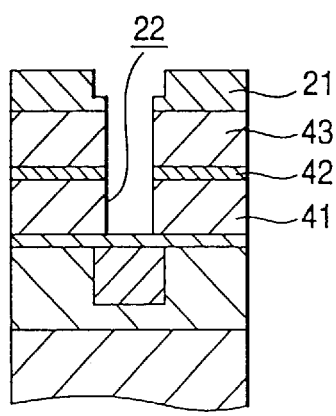

At the next step, as shown in FIG. 4C, the second inter-layer insulating film 43, etching stopper layer 42 and first inter-layer insulating film 41 are anisotropically etched using the etching mask 21, thereby to provide the contact hole 22. In the anisotropic etching, the second inter-layer insulating film 43 is first etched.

In an example, the anisotropic etching was so implemented that a conventional ECR plasma etching equipment was employed, that nitrogen ($N_2$) and helium (He) were used as an etching gas, and that the pressure of an etching atmosphere, the level of microwave power and the level of bias RF power were respectively set at 1 [Pa], 1 [kW] and 300 [W] as etching conditions. Next, the etching of the etching stopper layer 42 was implemented by way of example so that a conventional plasma etching equipment was employed, that octafluorobutene ($C_4F_8$), argon (Ar) and carbon monoxide (CO) were used as an etching gas, and that the pressure of an etching atmosphere and the level of RF power were respectively set at 6 [Pa] and 1.5 [kW] as etching conditions. The etching of the second inter-layer insulating film 43 is once stopped by the etching stopper layer 42, but this etching stopper layer 42 is etched by changing the etching conditions as stated above. Further, the etching of the first inter-layer insulating film 41 was implemented, for example, by employing a conventional ECR plasma etching equipment, and under the same etching conditions as those of the second inter-layer insulating film 43. Besides, at the same time that the second inter-layer insulating film 43 and the first inter-layer insulating film 41 are etched, the resist film 17 (refer to FIG. 3B) is also etched and is completely removed from on the etching mask 21 before the end of the etching of the first inter-layer insulating film 41. It is therefore unnecessary to remove the resist film 17 by ashing.

Incidentally, the etching steps for forming the contact hole 22 can also be consecutively implemented by employing a single etching equipment and selecting etching gases suited to the materials to-be-etched.

In addition, although the first inter-layer insulating film 41 and the second inter-layer insulating film 43 are formed of the same kind of insulating material in the third embodiment, they can also be formed of different kinds of insulating materials as long as the materials are etched under the same etching conditions.

Besides, in such a case where the resist film 17 is etched and removed during the etching of the second inter-layer insulating film 43, the inorganic film 13 to become the etching mask 21 may be previously formed to a thickness of, for example, about 350 [nm] increased about 50 [nm].

Figure 4D:
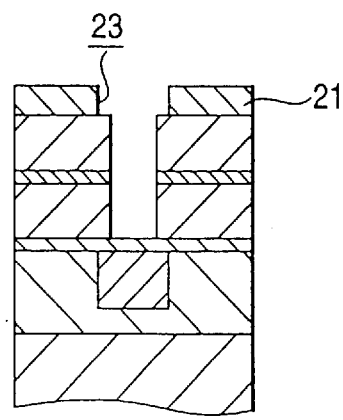

Further, as shown in FIG. 4D, the whole surface of the etching mask 21 is etched back by anisotropic etching so as to remove that part of the etching mask 21 which surrounds the second opening pattern 19 (refer to FIG. 4B) and to transfer the shape of the first opening pattern 16 (refer to FIG. 4A) onto the lower part of the etching mask 21. Thus, a third opening pattern 23 for forming the wiring groove is formed at each of the corresponding parts of the whole etching mask 21. The upper part of the etching mask 21 is removed by the etching, so that the etching mask 21 becomes about 200 [nm] thick. In an example, the etching was so implemented that a conventional plasma etching equipment was employed, that octafluorobutene ($C_4F_8$), argon (Ar) and carbon monoxide (CO) were used as an etching gas, and that the pressure of an etching atmosphere and the level of RF power were respectively set at 6 [Pa] and 1.5 [kW] as etching conditions.

Figure 4E:
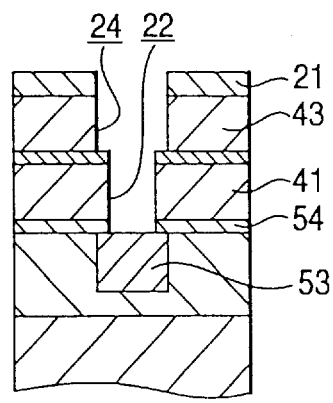

Subsequently, as shown in FIG. 4E, the second inter-layer insulating film 43 is anisotropically etched using the resulting etching mask 21, thereby to form the wiring groove 24 in the second inter-layer insulating film 43. In an example, the anisotropic etching was so implemented that a conventional ECR plasma etching equipment was employed, that nitrogen ($N_2$) and helium (He) were used as an etching gas, and that the pressure of an etching atmosphere, the level of microwave power and the level of bias RF power were respectively set at 1 [Pa], 1 [kW] and 300 [W] as etching conditions.

Thereafter, that part of the diffusion prevention layer 54 which underlies the bottom of the contact hole 22 is etched so as to denude the wiring line 53 at the bottom of the contact hole 22.

Figure 4F:
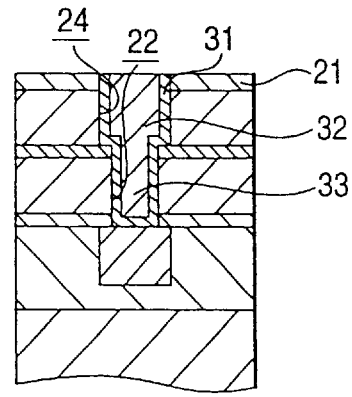

Subsequently, as shown in FIG. 4F, a barrier metal layer 31 made of, for example, tantalum nitride is formed on the walls of the wiring groove 24 and the contact hole 22 to a thickness of, for example, 50 [nm] by sputtering, evaporation or CVD. On that occasion, the barrier metal layer 31 is also extended on the etching mask 21. For example, in the case of forming the barrier metal layer 31 by the sputtering, a tantalum nitride film can be formed by employing a tantalum target and introducing nitrogen gas into a film forming atmosphere.

Subsequently, a seed layer (not shown) is formed on the walls of the wiring groove 24 and the contact hole 22 through the barrier metal layer 31 by, for example, ionization sputtering, whereupon a wiring material (metal), for example, copper is deposited by electroplating. Thereafter, the excessive parts of the metal copper and the barrier metal layer 31 lying on the etching mask 21 are polished and removed by, for example, CMP. Thus, a wiring line 32 made of the metal copper is formed in the wiring groove 24 through the barrier metal layer 31, while a plug 33 made of the metal copper is formed in the contact hole 22 through the barrier metal layer 31. On that occasion, the etching mask 21 serves as a polishing stopper, and it is completely removed in some cases, depending upon its thickness. Incidentally, although the metal copper is inlaid in the above example, another metal material such as aluminum, serving as the wiring material, may well be inlaid.

Although no illustration is made, multilayer wiring can be formed by iteratively executing the processing steps from the step of forming the inter-layer insulating film 12, to the step of forming the wiring line 32 and the plug 33. Also, the part of the inter-layer insulating film 52 between the wiring lines 53 can be formed of an organic material by a process similar to the foregoing.

Besides, although the above description has mentioned the example in which the inter-layer insulating film 12 is formed on the baseplate 11 formed with the semiconductor elements, the manufacturing method is also applicable to a case where the inter-layer insulating film 12, contact hole 22, wiring groove 24, wiring line 32, plug 33, etc. constructed as described above are formed on a baseplate which is not formed with any semiconductor element.

According to the manufacturing method described with reference to FIGS. 4A thru 4F, the second inter-layer insulating film 43 is etched by employing as the etching mask 21 the inorganic film 13 formed with the first opening pattern 16 and the second opening pattern 19, whereby the contact hole 22 is first formed. Besides, the second inter-layer insulating films 43 is etched by employing as the etching mask 21 the inorganic film 13 in the state in which only the third opening pattern 23 obtained by transferring the first opening pattern 16 has been formed by the etching, whereby the wiring groove 24 is formed. In the above etching, the etching stopper layer 43 suffices with only the function of the etching stopper in the case of etching the second inter-layer insulating film 43 for forming the wiring groove 24, and hence, it can be formed to the thickness which is, at least, the value sufficient for the action of the etching stopper, and which is less than 50 [nm]. Therefore, even when the etching stopper 42 is formed between the first inter-layer insulating film 41 and the second inter-layer insulating film 43, the effective permittivity of the whole inter-layer insulating film 12 is not sharply raised, and the permittivity becomes lower than in the prior-art structure in which the intermediate layer made of the inorganic film is disposed within the inter-layer insulating film.

Besides, in the case where the resist process is employed for each of the step of forming the first opening pattern 16 in the inorganic film 13 and the step of forming the second opening pattern 19 therein, it is permitted to proceed in the state in which the inter-layer insulating film 12 is not denuded. More specifically, the regeneration of the resist process can be done for the reason that the inorganic film 13 covers the inter-layer insulating film 12 in the resist process for forming the first opening pattern 16 in the inorganic film 13, and for the reason that the resist film 17 is underlaid with the inorganic film 13 in the resist process for forming the second opening pattern 19 in the inorganic film 13.

The inter-layer insulating film 12, first inter-layer insulating film 41 and second inter-layer insulating film 43 explained in the foregoing embodiments can also be formed of fluorocarbon resin or xerogel. Examples of the fluorocarbon resin usable are fluorocarbon (for example, cyclic fluorocarbon resin), teflon (PTFE), amorphous teflon (for example, "Teflon AF" (tradename) produced by DuPont), polyaryl ether, and polyimide fluoride. An example of the xerogel is porous silica.

The film of the fluorocarbon resin is formed in such a way that the forerunner thereof is applied by a spin coating equipment, followed by curing at 300 [° C.]~450 [° C.]. Incidentally, a material such as fluoridized amorphous carbon can be formed into a film by plasma CVD in which acetylene ($C_2H_2$)sand fluorocarbon gas (for example, octafluorobutene ($C_4F_8$)) are employed as a process gas. Also in this case, the film formed is cured at 300 [° C.]~450[° C.]. Further, the amorphous teflon is not restricted to the product "Teflon AF", but it may be any having a structure indicated by the following chemical formula (1):

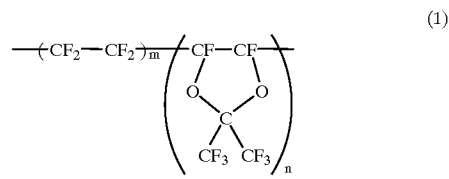

(1)

(in the formula, letters m and n denoted plus intergers)

It is also possible to employ cyclopolymerized fluorinated polymer-type resin (for example, "SITOP" (tradename) produced by Asahi Glass Company) for the second inter-layer insulating film 43. The cyclopolymerized fluorinated polymer-type resin is not restricted to the product "SITOP", but it may be any having a structure indicated by the following chemical formula (2):

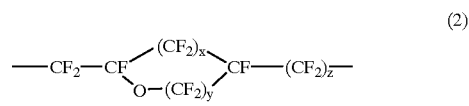

(2)

(in the formula, letters x, y and z denote plus integers)

It is also possible to employ fluoridized polyaryl ether-type resin (for example, "FLARE" (tradename) produced by AlliedSignal Inc.) for the second inter-layer insulating film 43. The fluoridized polyaryl ether-type resin is not restricted to the product "FLARE", but it may be any having a structure indicated by the following chemical formula (3):

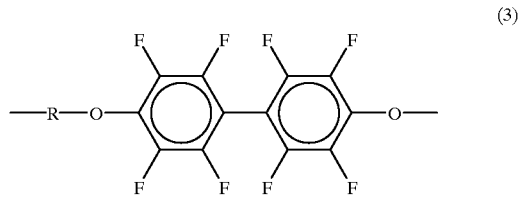

(3)

(in the formula, letter R denotes an alkyl group)

Besides, in case of employing the xerogel for the second inter-layer insulating film 43, an example was so implemented that nanoporous silica ("Nanoglass" (tradename) developed by AlliedSignal Inc.) was formed into a film by employing a spin coating equipment developed by Allied-Signal Inc. The nanoporous silica is a kind of porous silica, and the xerogel which can be employed in the present invention is not restricted to the nanoporous silica. Concretely, any xerogel is applicable as long as it has been prepared in such a way that a substrate is coated with silanol resin having the alkyl group of a comparatively high polymer, such as aromatic, that the coating is caused to gelate, and that the gel is subjected to hydrophobing by employing a silane coupling agent or hydrogenation.

In a case where multilayer wiring is formed in accordance with the manufacturing method of the present invention, it can be formed by combining at least two of the first~third embodiments of the manufacturing method.

As described above, according to the present invention, a first opening pattern for forming a wiring groove and a second opening pattern for forming a contact hole are formed in a single-layer inorganic film, and the wiring groove and the contact hole are formed in an inter-layer insulating film by employing the inorganic film as an etching mask, so that an intermediate layer functioning as an etching mask in the case of forming a contact hole in the prior art need not be provided. Therefore, the step of forming the intermediate layer can be omitted. Moreover, since the intermediate layer is not formed in the inter-layer insulating film, the effective permittivity of the inter-layer insulating film can be made lower than in the prior art.

In addition, according to a manufacturing method in which an inter-layer insulating film is formed of first and second inter-layer insulating films, and in which an etching stopper layer is interposed therebetween, it is permitted by the etching stopper layer to form a wiring groove reliably at a predetermined depth. Further, since the etching stopper layer suffices with only the function of an etching stopper, it can be formed thinner than the intermediate layer having the function of the etching mask in the prior art. Therefore, the effective permittivity of the inter-layer insulating film can be lowered.

Besides, in a case where a resist process is employed for each of the steps of forming the first opening pattern and the second opening pattern, the inorganic film is covered with the inter-layer insulating film during the resist process, and hence, the regeneration of each resist process can be done. As a result, an available percentage can be enhanced.

It is therefore permitted to form a dual damascene structure at a high available percentage and at a low cost by a smaller number of processing steps than in the prior-art manufacturing method, while the effective permittivity of the inter-layer insulating film is lowered.

What is claimed is:

1. A method of manufacturing a semiconductor device which has an inter-layer insulating film, comprising:

the step of forming an inorganic film on said inter-layer insulating film, said inorganic film being to serve as an etching mask in a case where said inter-layer insulating film is etched;

the step of forming a first opening pattern in an upper part of said inorganic film, said first opening pattern serving to form a wiring groove in said inter-layer insulating film; and the step of subsequently forming a second opening pattern in said inorganic film, said second opening pattern serving to form a contact hole in said inter-layer insulating film and being formed so as to be radially smaller than said first opening pattern and to coincide with said first opening pattern.

2. A method of manufacturing a semiconductor device as defined in claim 1, further comprising:

the step of forming said contact hole in said inter-layer insulating film by employing as said etching mask said inorganic film formed with said first opening pattern and said second opening pattern;

the step of etching said inorganic film into a state where it is formed with only a third opening pattern obtained by transferring said first opening pattern; and the step of forming said wiring groove in said inter-layer insulating film by employing as an etching mask said inorganic film formed with said third opening pattern.

3. A method of manufacturing a semiconductor device as defined in claim 1, wherein said inter-layer insulating film is formed of a member selected from the group consisting of an organic material and xerogel.

4. A method of manufacturing a semiconductor device as defined in claim 2, wherein said inter-layer insulating film is formed of a member selected from the group consisting of an organic material and xerogel.

5. A method of manufacturing a semiconductor device as defined in claim 1, wherein said inter-layer insulating film is formed by carrying out:

the step of forming a first inter-layer insulating film;

the step of forming an etching stopper layer made of an insulating film, on said first inter-layer insulating film; and the step of forming a second inter-layer insulating film on said etching stopper layer;

said etching stopper layer being formed of the same kind of material as that of said inorganic film which is to serve as said etching mask.

6. A method of manufacturing a semiconductor device as defined in claim 5, further comprising:

the step of forming an aperture in said second inter-layer insulating film by employing as said etching mask said inorganic film formed with said first opening pattern and said second opening pattern;

the step of etching said inorganic film into a state where it is formed with only a third opening pattern obtained by transferring said first opening pattern, and etching a part of said etching stopper layer under a bottom of said aperture, thereby to form an opening; and the step of forming said wiring groove in said second inter-layer insulating film and said contact hole in said first inter-layer insulating film by employing as an etching mask said inorganic film formed with only said third opening pattern.

7. A method of manufacturing a semiconductor device as defined in claim 5, further comprising:

the step of forming said contact hole so as to extend from said second inter-layer insulating film to said first inter-layer insulating film, by employing as said etching mask said inorganic film formed with said first opening pattern and said second opening pattern;

the step of etching said inorganic film into a state where it is formed with only a third opening pattern obtained by transferring said first opening pattern; and the step of forming said wiring groove in said second inter-layer insulating film by employing as an etching mask said inorganic film formed with only said third opening pattern.

8. A method of manufacturing a semiconductor device as defined in claim 5, wherein said etching stopper layer is formed to a thickness which is, at least, a value sufficient for an action of an etching stopper in the case of etching said second inter-layer insulating film, and which is less than 50 nm.

9. A method of manufacturing a semiconductor device as defined in claim 6, wherein said etching stopper layer is formed to a thickness which is, at least, a value sufficient for an action of an etching stopper in the case of etching said second inter-layer insulating film, and which is less than 50 nm.

10. A method of manufacturing a semiconductor device as defined in claim 7, wherein said etching stopper layer is formed to a thickness which is, at least, a value sufficient for an action of an etching stopper in the case of etching said second inter-layer insulating film, and which is less than 50 nm.

11. A method of manufacturing a semiconductor device as defined in claim 5, wherein said first inter-layer insulating film and said second inter-layer insulating film are formed of a member selected from the group consisting of an organic material and xerogel.

12. A method of manufacturing a semiconductor device as defined in claim 6, wherein said first inter-layer insulating film and said second inter-layer insulating film are formed of a member selected from the group consisting of an organic material and xerogel.

13. A method of manufacturing a semiconductor device as defined in claim 7, wherein said first inter-layer insulating film and said second inter-layer insulating film are formed of a member selected from the group consisting of an organic material and xerogel.

14. A method of manufacturing a semiconductor device as defined in claim 1, wherein said step of subsequently forming a second opening pattern in said inorganic film comprises:

forming a resist film on said inorganic film; and patterning said resist film whereby an opening is formed within said first opening pattern that is of a same size as said second opening pattern that is radially smaller than, and coincides with, said first opening pattern.

* * * * *